(12) United States Patent
Hosseini et al.

(10) Patent No.: US 7,781,897 B2
(45) Date of Patent: Aug. 24, 2010

(54) SEMICONDUCTOR DEVICE AND METHOD FOR PRODUCING THE SAME

(75) Inventors: Khalil Hosseini, Weihmichl (DE); Eduard Knauer, Deuerling (DE); Joachim Mahler, Regensburg (DE); Peter Mederer, Regensburg (DE); Konrad Roesl, Teublitz (DE)

(73) Assignee: Infineon Technologies AG, Neubiberg (DE)

( * ) Notice: Subject to any disclaimer, the term of this patent is extended or adjusted under 35 U.S.C. 154(b) by 232 days.

(21) Appl. No.: 11/443,740

(22) Filed: May 31, 2006

(65) Prior Publication Data

US 2007/0090539 A1    Apr. 26, 2007

(30) Foreign Application Priority Data

May 31, 2005    (DE) ........................ 10 2005 025 465

(51) Int. Cl.
  *H01L 23/52* (2006.01)
(52) U.S. Cl. ...................................... 257/784
(58) Field of Classification Search .............. 257/782, 257/678–733, 787–796, E23.001–E23.194, 257/100, 433–434, 667, 772, 779; 438/112, 438/127
  See application file for complete search history.

(56) References Cited

U.S. PATENT DOCUMENTS

| | | | |
|---|---|---|---|
| 3,862,260 A | 1/1975 | Sellers et al. | |
| 4,123,308 A | 10/1978 | Nowlin et al. | |
| 5,824,568 A | 10/1998 | Zechman | |
| 6,117,705 A * | 9/2000 | Glenn et al. | 438/106 |
| 6,165,613 A | 12/2000 | Puglisi et al. | |
| 6,368,899 B1 | 4/2002 | Featherby et al. | |
| 6,404,068 B1 | 6/2002 | Tanaka et al. | |
| 2002/0089069 A1* | 7/2002 | Lamson et al. | 257/784 |
| 2006/0097405 A1* | 5/2006 | Webster et al. | 257/782 |

FOREIGN PATENT DOCUMENTS

| | | |
|---|---|---|
| DE | 296 22 972 | 9/1997 |
| DE | 19736091 A1 | 3/1999 |
| DE | 10255129 A1 | 5/2003 |
| JP | 03192738 A2 | 8/1991 |
| JP | 03192739 A2 | 9/1991 |
| WO | WO 2005/071741 | 8/2005 |

* cited by examiner

*Primary Examiner*—Dao H Nguyen
*Assistant Examiner*—Tram H Nguyen
(74) *Attorney, Agent, or Firm*—Dicke, Billig & Czaja, PLLC

(57) ABSTRACT

A semiconductor device has a circuit carrier with a number of internal contact areas is disclosed, which includes a first material with a first electrochemical potential, and a semiconductor chip with an active surface and a number of chip contact areas, which include a second material with a second electrochemical potential. Bonding wire connections are arranged between the chip contact areas and the internal contact areas of the leadframe and comprise a third material with a third electrochemical potential. The connecting points between the chip contact areas and the bonding wires and/or the connecting points between the internal contact areas and the bonding wires are coated with an anticorrosive layer.

12 Claims, 2 Drawing Sheets

SEMICONDUCTOR DEVICE AND METHOD FOR PRODUCING THE SAME

CROSS-REFERENCE TO RELATED APPLICATIONS

This Utility Patent Application claims priority to German Patent Application No. DE 10 2005 025 465.9 filed on May 31, 2005, which is incorporated herein by reference.

BACKGROUND

The invention relates to a semiconductor device and a method for producing the same.

FIELD OF THE INVENTION

Bonding wire connections between a semiconductor chip and a substrate within a plastic package may be unreliable. During operation or under thermal or mechanical loading, the wire connections may become detached from the contact areas, which can lead to failure of the entire device.

One particular problem is especially that the connecting point between the bonding wire and the contact area may corrode. Corrosion of the connecting points leads to a significant weakening of the strength of the connection of the wires on the chip contact areas. Corrosion of the connecting points is a particular problem in the case of semiconductor devices which have halogen-containing or halogen-free molding compounds.

This problem was previously handled by using suitable wire materials and/or improvements to the wire connecting processes. These approaches do not solve the problem completely, so that further improvements are still necessary.

A further method for protecting the bonding wires and their connections is to use an elastic protective encapsulation comprising siloxanes. This method has the disadvantage that the molding compound adheres only poorly on siloxanes. Inadequate adhesion between the siloxanes and the plastic compound leads to moisture collecting in the boundary layer. This expands abruptly when, as it is being soldered onto a printed circuit board, the semiconductor device reaches temperatures of up to 260° C. in an extremely short time. The abrupt expansion results in cracks and/or ruptures in the plastic encapsulation of the semiconductor device, which is referred to as the "popcorn effect".

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

SUMMARY

Figure 1:
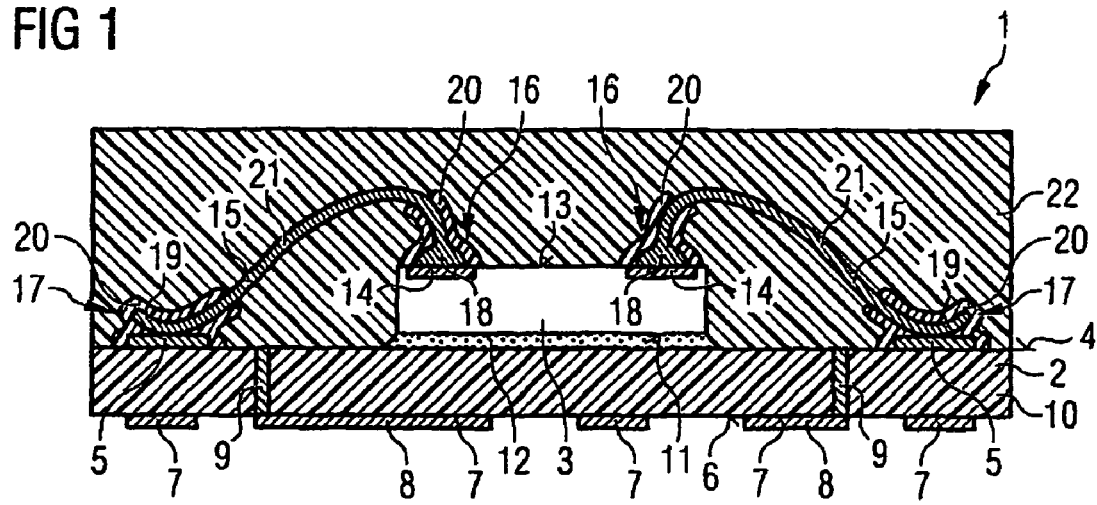
FIG. 1 illustrates a cross section through a semiconductor device according to the invention with selectively coated connecting points.

The present invention provides a semiconductor device having a circuit carrier with a number of internal contact areas, which include a first material with a first electrochemical potential, and a semiconductor chip with an active surface and a number of chip contact areas, which include a second material with a second electrochemical potential. Bonding wire connections are arranged between the chip contact areas and the internal contact areas of the circuit carrier and include a third material with a third electrochemical potential. The connecting points between the chip contact areas and the bonding wires and/or the connecting points between the internal contact areas and the bonding wires are coated with an anticorrosive layer.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a reliable semiconductor device and a method for its production, in particular a semiconductor device on which the bonding wire connections are protected from corrosive constituents which may be released during operation, in particular by the molding compound.

In a first embodiment, the invention provides a semiconductor device which has a circuit carrier with a number of internal contact areas. The internal contact areas include a first material with a first electrochemical potential. The semiconductor device also has a semiconductor chip with an active surface and a back side. The active surface has a number of chip contact areas, which include a second material with a second electrochemical potential.

Bonding wire connections are arranged between the chip contact areas and the internal contact areas of the leadframe, the bonding wires having a third material with a third electrochemical potential.

According to one embodiment of the invention, the connecting points between the chip contact areas and the bonding wires and/or the connecting points between the internal contact areas and the bonding wires are coated with an anticorrosive layer.

The anticorrosion layer is used here to have the same meaning as a corrosion protection coating.

In an embodiment, only the connecting points between the chip contact areas and the bonding wires and/ore the connecting points between the internal contact areas and the bonding wires are coated with an anticorrosion layer.

In a further embodiment only the bonding wires including the connecting points between the chip contact areas and the bonding wires and/ore the connecting points between the internal contact areas and the bonding wires are coated with an anticorrosion layer.

The bonding wires and the chip contact area and/or the internal contact areas include different materials with different electrochemical potentials. Atmospheric moisture and moisture from the plastic compound can have the effect of an electrolyte on the boundary surface. This may lead to corrosion of the connecting point and failure of the device as a result of the formation of a local element. During the bonding connection process, intermetallic phases may be formed at the boundary between the materials. The intermetallic phases may also be impaired by atmospheric moisture and by the components or composition of the plastic compound. In the case of halogen-containing molding compounds, constituents which may corrode the connecting points, Br for example, may be released during operation.

According to one embodiment of the invention, the anticorrosive layer makes it possible to stabilize the connecting point and prevents detachment of the bonding connections. Furthermore, the anticorrosive layer provides mechanical protection for the connecting point. The formation of a local element is prevented.

The surfaces of the semiconductor chip other than those immediately adjacent the connecting points between the bonding wires and the chip contact surfaces and the surfaces of the circuit carrier other than those immediately adjacent the connecting points between the bonding wires and the internal contact areas may remain free from the anticorrosion layer.

The anticorrosive layer according to the invention may be advantageously realized in various types of devices, for example Ball Grid Array (BGA) devices, power semiconductor devices and diodes, which have bonding wire connections. The circuit carrier may be a flat conductor frame or a wiring substrate.

In one embodiment, a polymer layer is provided as the anticorrosive layer. The polymer layer preferably has one of the following end polymers and/or formulations which contain these end polymers either as a precursor and/or directly: polyimides, polyurethanes, epoxies, polyisocyanates, liquid-crystalline polymers, high-temperature resistant thermoplastics, phenolic resins, unsaturated polyesters, amino resins, silicones and all polymers which have sulfur in the main chain or the secondary chain, such as for example polyphenylene sulfides, polyether sulfones.

All the substances according to the invention also have in common that they are thermally stable at least up to about 235° C., some up to about 245° C. and some up to about 260° C. "Thermally stable" means here that the anticorrosive layer in the finished semiconductor device can be exposed to these temperatures without any notable decomposition for time periods such as those which typically occur when a semiconductor device is being soldered in.

This thermal stability is makes the present invention suitable for the use with lead-free solder materials. Lead-free solders require higher soldering temperatures as a result of the materials involved, so that the temperature may rise to about 260° C. when the semiconductor device is soldered onto a PCB.

In the case of encapsulated semiconductor devices, the substances for coating may be chosen such that the resultant polymer layer on the side directed toward the plastic compound has specific end groups which have a particular affinity with the chosen plastic compound of the device. On the side directed toward the metallic connecting point, the polymer layer has end groups which have a particular affinity with the corresponding material of the connecting point.

Furthermore, the polymer layer of the anticorrosive layer may additionally have in the main chains and/or side chains one or more of the following functional groups: sulfone group, mercapto group, amino group, carboxyl group, cyano group, keto group, hydroxyl group, silano group and/or titano group and/or mixtures thereof.

The polymer precursor may also have a mixture of two or more of the polymers mentioned here. Furthermore, it is possible for the polymer layer to comprise one or more layers, each layer having one or more of the polymers mentioned here.

A multilayer coating allows each layer to have different properties. For example, the first layer ideally exhibits good adhesion to metals, semiconductors, plastics and ceramic oxides and nitrides, as well as to a further layer applied on top of it. This layer then has at least one further layer applied to it, having good adhesion both to the first layer and to the plastic compound. Furthermore, there is the possibility of incorporating buffer layers, with for example particular mechanical properties.

Particularly suitable for this according to the present invention are polyimides, polybenzimidazoles, polyoxazole and copolymers which have at least one of the stated polymers or engineering thermoplastics.

Furthermore, it is conceivable and possible for the anticorrosive layer according to the invention to be a suspension and to have additional substances such as solvents, adhesion promoters, antioxidants, catalysts, reinforcing fillers, plasticizers and/or UV stabilizers. Furthermore, there is the possibility of the substance having copolymers.

After applying the precursor, the polymer layer according to the invention is produced, in that either the solvent required for the application is vaporized or in that the applied polymer precursor is crosslinked to form the polymer, for example by means of thermal or UV curing.

The anticorrosive layer is very thin and ideally has a layer thickness of approximately 0.5 µm to 50 µm. The entire length of the bonding wires and the connecting point may be coated with the anticorrosive layer. In this embodiment, the coating method is simplified.

In a further embodiment of the invention, the connecting points may be coated with the anticorrosive layer, while the middle regions of the bonding wires remain free of the anticorrosive layer. This arrangement provides that the middle regions of the bonding wires that are free are not under the weight of an anticorrosive layer. This avoids the risk of the bonding wires sinking during the coating and short circuits occurring between the bonding wires.

The anticorrosive layer according to the invention has the further advantage that the connecting point is also protected from mechanical loading. The reliability of the bonding wire connections, and consequently of the device, is thereby further increased.

In a further embodiment, the semiconductor chip and the bonding wires are embedded in a plastic compound. The plastic compound also forms the package of the device and further protects the semiconductor chip and the bonding wires from mechanical loading.

In one embodiment, the third material of the bonding wires has a more positive electrochemical potential than the second material of the chip contact area.

The third material of the bonding wires may have a more positive electrochemical potential than the first material of the internal contact areas.

In one embodiment, the chip contact areas include aluminum or an aluminum alloy and the bonding wires comprise gold or a gold alloy. The use of these materials in the case of semiconductor devices is known.

Gold has an electrochemical potential of +1.42 V and aluminum an electrochemical potential of −1.67 V. Gold consequently lies higher in the electrochemical series and has a more positive potential than aluminum. Therefore, corrosion of the connecting point and of the produced Au4Al intermetallic phases is possible. This problem is overcome by the anticorrosive layer according to the invention.

Furthermore, the invention provides for a method for producing a semiconductor device with an anticorrosive layer.

The method for producing a device has the following process. Firstly, a circuit carrier, a semiconductor chip and a wire for producing bonding wire connections are provided.

The circuit carrier has a number of internal contact areas of a first material with a first electrochemical potential. The semiconductor chip has an active surface and a back side, the active surface having a number of chip contact areas which comprise a second material with a second electrochemical potential. The wire comprises a third material with a third electrochemical potential.

The back side of the semiconductor chip is attached on the leadframe and bonding wire connections are produced between the chip contact areas and the internal contact areas of the leadframe.

The connecting points between the bonding contact areas and the bonding wires and/or the connecting points between the internal contact areas and the bonding wires are coated with an anticorrosive layer.

Known methods for producing semiconductor devices up to the coating of the anticorrosive layer can be used. The device according to the invention can consequently be produced at low cost.

In one embodiment, the connecting points are coated with the anticorrosive layer by coating the bonding wires over their full surface area. In an alternative embodiment, after coating over the full surface area, selective detachment of the anticorrosive layer is carried out. The middle regions of the bonding wires are consequently stripped of the anticorrosive layer. The anticorrosive layer may be selectively detached by means of solvents or laser ablation or mechanical removal.

In both of these embodiments, the surfaces of the semiconductor chip and of the circuit carrier which are not immediately adjacent the connection points are free of the anticorrosive layer. The anticorrosive layer is, therefore, selectively provided on only the bond wires including the connection points or on only the connection points of the bonding wires.

In a further embodiment, the connecting points are coated with the anticorrosive layer by selective application of a layer. A structured layer may be selectively applied to the connecting points by means of a pressure jet technique or selective masking, so that the middle regions of the bonding wires remain free of the anticorrosive layer. This method has the advantage that the anticorrosive layer can be selectively applied in one process.

In one embodiment, a polymer layer is provided as the anticorrosive layer. A polymer layer may be applied in the form of a suspension or a polymer precursor. The polymer layer is produced by thermal vaporizing of a solvent or by polyreaction of the polymer precursor.

Once the connecting points have been coated with the anticorrosive layer, in one embodiment the semiconductor chips and the bonding wires are embedded in a plastic compound. The plastic compound forms the plastic package of the device.

The connecting points between the bonding wires and the chip contact areas are produced by means of thermocompression or ultrasound bonding-wire connecting techniques. Known methods and devices can be used. The device according to the invention can consequently be produced at low cost.

FIG. 1 illustrates a greatly enlarged cross section through a semiconductor device 1 according to a first exemplary embodiment of the invention. The drawing is not to scale; the relative sizes are shown distorted to illustrate the schematic structure.

The semiconductor device 1 has a substrate 2 and a semiconductor chip 3. The substrate 2 has on its upper side 4 internal contact areas 5, which comprise copper, and on its underside 6, external contact areas 7. The internal contact areas 5 are electrically connected to the external contact areas 7 by means of interconnects 8 and contact vias 9. The interconnects 8 and contact vias 9 form the wiring structure of the substrate 2. In this exemplary embodiment, the substrate 2 has a dielectric layer 10. The interconnects are arranged on the upper side 4 and on the underside 6 of the dielectric layer 10.

The back side 11 of the semiconductor chip 3 is attached on the upper side 4 of the substrate 2 by means of an attachment layer 12. The internal contact areas 5 are arranged around the semiconductor chip 3. The active surface 13 of the semiconductor chip 3 has integrated circuits (which are not represented in the figures) and chip contact areas 14. The chip contact areas 14 are electrically connected to the internal contact areas 5 by means of bonding wires 15. The chip contact areas 14 include aluminum and the bonding wires 15 include gold.

A bonding connection 15 extends from a chip contact area 14 to an internal contact area 5 and consequently has a first connecting point 16 and a second connecting point 17. The first connecting point 16 is formed by the thermocompression head 18 of the bonding wire 15 and the chip contact area 14. The second connecting point 17 is formed by the internal contact area 5 and the wedge bond 19 of the bonding wire 15.

In the exemplary embodiment which can be seen in FIG. 1, the two connecting points 16, 17 and a short section of the adjacent wire 15 are coated with an anticorrosive layer 20, which comprises polyimide. The middle regions 21 of the bonding wires 15 are free of the anticorrosive layer 20. The remaining surfaces of the semiconductor chip 3 and substrate 2, which are embedded in the plastic compound 22, remain uncovered by the anticorrosive layer 20.

The semiconductor chip 3, the upper side 4 of the substrate 2 and the bonding wires 15 are surrounded by a plastic compound 22. The middle regions 21 of the bonding wires and the surface of the anticorrosive layer 20 are embedded in the plastic compound 22.

Figure 2:
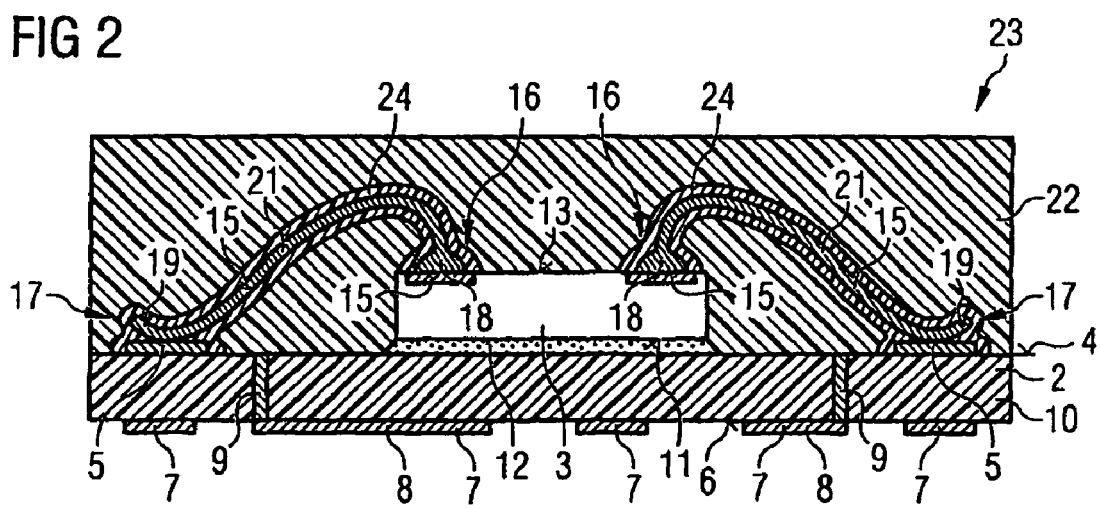
FIG. 2 illustrates a cross section through a semiconductor device according to the invention with complete coating of the bonding wire connections.

FIG. 2 illustrates a greatly enlarged cross section through a semiconductor device with complete coating of the bonding wires 15 and the connecting points 16, 17 according to a second exemplary embodiment. The drawing is not to scale; the relative sizes are shown distorted to illustrate the schematic structure.

By contrast with the embodiment of the present invention that is illustrated in FIG. 1, in the case of the embodiment according to FIG. 2 the middle regions 21 and the two connecting points 16, 17 are covered with an anticorrosive layer 24 of polyimide. Similarly to the embodiment of FIG. 1, the remaining surfaces of the semiconductor chip 3 and substrate 2, which are embedded in the plastic compound 22, remain uncovered by the anticorrosive layer 20.

Various embodiments according to the present invention are conceivable and possible. In one embodiment not illustrated here, all the surfaces within the plastic compound 22 are covered with an anticorrosive layer.

A device 1 according to the invention is produced by the following method. The semiconductor chip 3 is mounted on the upper side 4 of the substrate 2 by means of an attachment layer 12. The bonding wire connections 15 between the chip contact areas 14 and the internal contact areas 5 of the substrate 2 are produced, in order that the semiconductor chip 3 is electrically connected to the substrate 2.

Selective coating of the bonding wires 15 with the anticorrosive layer 20 can be achieved by masking the regions that are not to be coated while carrying out spray coating to produce the layer 20.

Furthermore, it is possible to carry out selective coating of the bonding wire 15 or the connecting points 16, 17 with the anticorrosive layer 20 by selectively spraying the regions to be coated by a spraying method with a defined nozzle arrangement, nozzle size, spraying time and/or pressure or by a pressure jet technique.

Subsequently, the semiconductor chip 3, bonding wires 15 and upper side 4 of the substrate 2 are embedded in a plastic compound 22. External contacts can then be applied to the external contact areas, in order that the device 1 can be mounted on a printed circuit board. The device 1 can be tested.

Figure 3:
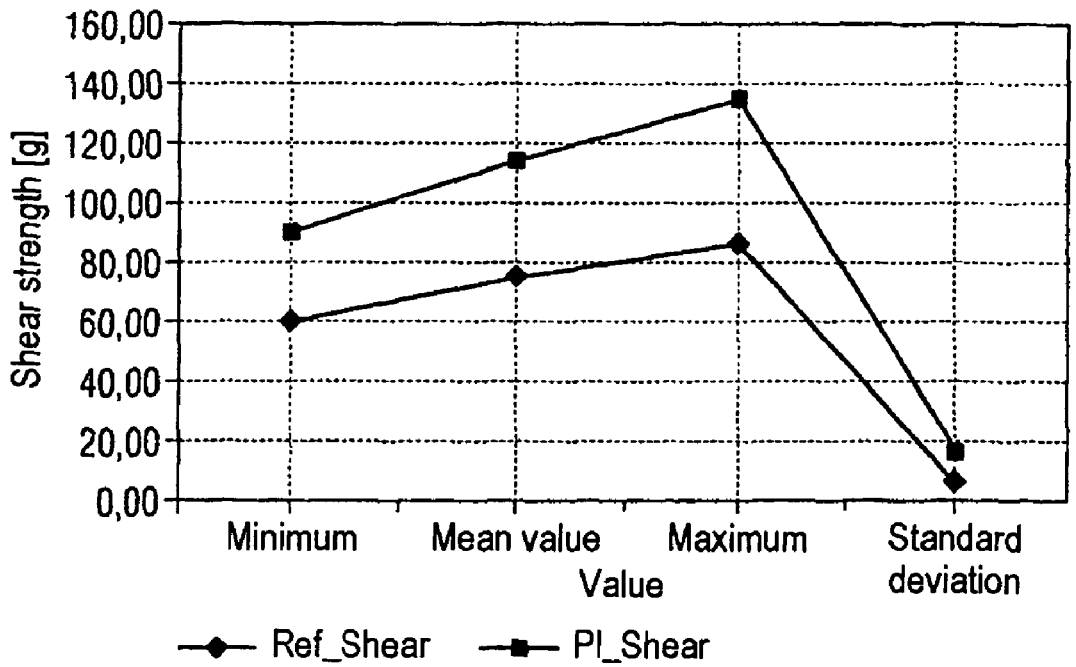
FIG. 3 illustrates the results of shear strength comparative tests for known bonding wires and bonding wires according to the invention.
Figure 4:
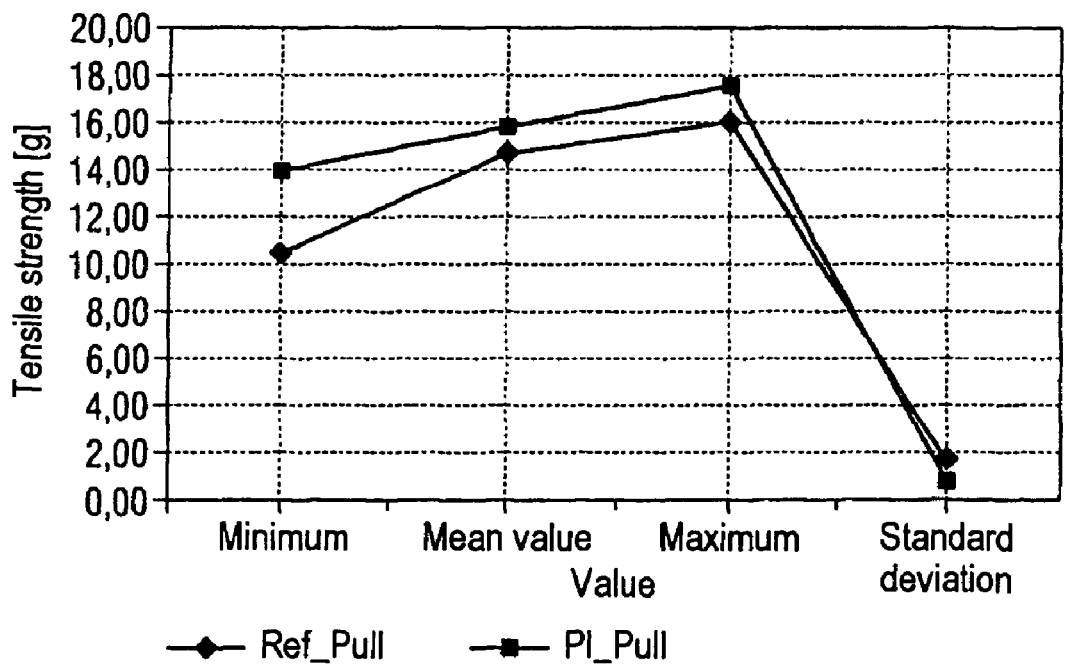
FIG. 4 illustrates the results of tensile strength comparative tests for known bonding wires and bonding wires according to the invention.

In FIG. 3, results of comparative tests of the shear strength of bonding wires are illustrated. In FIG. 4, results of comparative tests of the tensile strength of bonding wires are illustrated. Gold wires with a diameter of 30 μm were investigated. The results for an uncoated gold wire are denoted by lozenges. The results for a gold wire with a polyimide coating according to the invention are denoted by rectangles.

It can be seen from FIGS. 3 and 4 that a gold wire with a coating according to the invention has increased shear strength and tensile strength. The shear strengths of gold wires with the coatings according to the invention after exposure to thermal loads are greatly improved in comparison with uncoated wires.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a circuit carrier with a number of internal contact areas, which comprise a first material with a first electrochemical potential;
a semiconductor chip with an active surface and a back side, the active surface having a number of chip contact areas, which comprise a second material with a second electrochemical potential; and
bonding wire connections between the chip contact areas and the internal contact areas of the circuit carrier, the bonding wires comprising a third material with a third electrochemical potential;
connecting points between the chip contact areas and the bonding wires and connecting points between the internal contact areas and the bonding wires being coated with an anticorrosive layer; and
wherein the surfaces of the semiconductor chip other than those immediately adjacent the connecting points between the bonding wires and the chip contact areas and the surfaces of the circuit carrier other than those immediately adjacent the connecting points between the bonding wires and the internal contact areas remain free from, the anticorrosive layer; and
wherein the anticorrosive layer includes a first polymer layer directed towards the connecting points between the bonding wires and the chip contact areas and the surfaces of the circuit carrier with end groups which have a particular affinity with material of the connecting point, and a second polymer layer directed towards a plastic compound encapsulating the bonding wires with end groups which have a particular affinity with the plastic compound.

2. The semiconductor device as claimed in claim 1, wherein the polymer layer comprises one or more of the following substances:
imidazoles
polyisocyanates
liquid-crystalline polymers
high-temperature resistant thermoplastics
phenolic resins
amino resins
unsaturated polyesters
polybenzoxazoles
polyoxazole
polybenzimidazoles
polyimides
epoxies
polyurethanes
polymers with sulfur in the main chain
polymers with sulfur in the secondary chain.

3. The semiconductor device as claimed in claim 1, wherein the polymer layer additionally comprises in main chains and/or secondary chains one or more of the following functional groups:
sulfone group
mercapto group
amino group
carboxyl group
cyano group
keto group
hydroxyl group
silano group
titano group.

4. The semiconductor device as claimed in claim 1, wherein the anticorrosive layer comprises one or more copolymers.

5. The semiconductor device as claimed in claim 1, wherein the anticorrosive layer comprises a mixture of two or more polymers.

6. The semiconductor device as claimed in claim 1, wherein the anticorrosive layer comprises one or more layers, each layer having one or more polymers.

7. The semiconductor device as claimed in claim 1, wherein the anticorrosive layer comprises one or more of the following auxiliaries:

solvents
adhesion promoters
antioxidants
catalysts
reinforcing fillers
plasticizers
UV stabilizers.

8. The semiconductor device as claimed in claim 1, comprising wherein middle regions of the bonding wires remain free of the anticorrosive layer.

9. The semiconductor device as claimed in claim 1, wherein the semiconductor chip and the bonding wires are embedded in a plastic compound.

10. The semiconductor device as claimed in claim 1, comprising wherein the third material of the bonding wires has a more positive electrochemical potential than the second material of the chip contact areas.

11. The semiconductor device as claimed in claim 1, comprising wherein the third material of the bonding wires has a more positive electrochemical potential than the first material of the internal contact areas.

12. The semiconductor device as claimed in claim 1, comprising wherein the chip contact areas comprise aluminum or an aluminum alloy and the bonding wires comprise gold or a gold alloy.

* * * * *